United States Patent
Ma et al.

(10) Patent No.: US 12,373,052 B2
(45) Date of Patent: Jul. 29, 2025

(54) DISPLAY PANEL AND DISPLAY APPARATUS

(71) Applicant: WUHAN TIANMA MICRO-ELECTRONICS CO., LTD., Wuhan (CN)

(72) Inventors: Yufang Ma, Wuhan (CN); Haiyan Wu, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 18/404,006

(22) Filed: Jan. 4, 2024

(65) Prior Publication Data

US 2024/0143099 A1 May 2, 2024

(30) Foreign Application Priority Data

Aug. 4, 2023 (CN) .......................... 202310982429.4

(51) Int. Cl.
*G06F 3/041* (2006.01)
*G06F 3/044* (2006.01)
*H10K 50/844* (2023.01)
*H10K 59/131* (2023.01)
*H10K 59/40* (2023.01)

(52) U.S. Cl.
CPC .......... *G06F 3/0412* (2013.01); *G06F 3/0443* (2019.05); *H10K 50/844* (2023.02); *H10K 59/131* (2023.02); *H10K 59/40* (2023.02)

(58) Field of Classification Search
CPC ............................... G06F 3/0446; G06F 3/044
See application file for complete search history.

(56) References Cited

U.S. PATENT DOCUMENTS

| | | | | |
|---|---|---|---|---|
| 2018/0348937 A1* | 12/2018 | Pak | ...................... | G06F 3/0446 |
| 2019/0214596 A1* | 7/2019 | Park | ...................... | G06F 3/0446 |
| 2020/0168671 A1* | 5/2020 | Jang | ...................... | H10K 59/131 |
| 2020/0273919 A1* | 8/2020 | Ding | ...................... | G06F 3/0448 |
| 2022/0011897 A1* | 1/2022 | Lee | ...................... | G06F 3/0412 |
| 2022/0011917 A1* | 1/2022 | Zhang | .................... | G06F 3/0446 |
| 2022/0317812 A1* | 10/2022 | Wang | ...................... | G09F 9/30 |
| 2022/0317816 A1* | 10/2022 | Niu | ...................... | G06F 3/0446 |
| 2024/0220040 A1* | 7/2024 | Han | ...................... | G06F 3/0412 |

FOREIGN PATENT DOCUMENTS

| | | |
|---|---|---|
| CN | 111427472 A | 7/2020 |
| WO | 2022057500 A1 | 3/2022 |

* cited by examiner

*Primary Examiner* — Sepehr Azari
(74) *Attorney, Agent, or Firm* — CHRISTENSEN O'CONNOR JOHNSON KINDNESS PLLC (57) ABSTRACT

A display panel and a display apparatus are described. The display panel includes a plurality of touch units. The touch units include first electrodes and second electrodes that are disposed in a same layer. Adjacent first electrodes along a first direction are connected through a bridge line, and adjacent second electrodes along a second direction are connected through a connecting line. The bridge line is disposed in a different layer from the first electrode, and the connecting line is disposed in a same layer as the second electrode. A display region has a through-hole, and the touch units include a first touch unit that at least partially surrounds the through-hole. The first touch unit includes at least two bridge units, the bridge unit is connected to two adjacent first electrodes along the first direction, and the bridge unit includes at least one bridge line.

19 Claims, 7 Drawing Sheets

DISPLAY PANEL AND DISPLAY APPARATUS

CROSS-REFERENCE TO RELATED DISCLOSURE

The present disclosure claims priority to Chinese Patent Application No. 202310982429.4, filed on Aug. 4, 2023, the content of which is incorporated herein by reference in its entirety.

TECHNICAL FIELD

The present disclosure relates to the technical field of displays, and, in particular, to a display panel and a display apparatus.

BACKGROUND

Some display panels include a through-hole disposed in a display region, and an optical component is disposed inside the through-hole. A display panel with both the through-hole and a touch sensing component in the display region may have poor touch effect around the through-hole.

SUMMARY

Aspects of the present disclosure provide a display panel and a display apparatus.

According to one first aspect of embodiments of the present disclosure, a display panel is provided. In an embodiment, the display panel includes a plurality of touch units located a display region of the display panel, and the plurality of touch units include first electrodes and second electrodes that are disposed in a same layer. In an embodiment, in the plurality of touch units, adjacent first electrodes along a first direction are connected through a bridge line, and adjacent second electrodes along a second direction are connected through a connecting line, where the first direction intersects the second direction. In an embodiment, the bridge line is disposed in a different layer from the first electrodes, and the connecting line is disposed in a same layer as the second electrodes. In an embodiment, the display region has a through-hole, and the plurality of touch units include a first touch unit that at least partially surrounds the through-hole. In an embodiment, the first touch unit includes N bridge units, each bridge unit is connected between two adjacent first electrodes along the first direction, and at least one of the bridge units each includes at least one bridge line, where N is an integer and N≥2.

According to another aspect of the present disclosure, a display apparatus is provided. In an embodiment, the display apparatus includes a display panel. In an embodiment, the display panel includes a plurality of touch units located a display region of the display panel, and the plurality of touch units include first electrodes and second electrodes that are disposed in a same layer. In an embodiment, in the plurality of touch units, adjacent first electrodes along a first direction are connected through a bridge line, and adjacent second electrodes along a second direction are connected through a connecting line, where the first direction intersects the second direction. In an embodiment, the bridge line is disposed in a different layer from the first electrodes, and the connecting line is disposed in a same layer as the second electrodes. In an embodiment, the display region has a through-hole, and the plurality of touch units include a first touch unit that at least partially surrounds the through-hole. In an embodiment, the first touch unit includes N bridge units, each bridge unit is connected between two adjacent first electrodes along the first direction, and at least one of the bridge units each includes at least one bridge line, where N is an integer and N≥2.

BRIEF DESCRIPTION OF DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and a person skilled in the art may still derive other drawings from these accompanying drawings without creative efforts.

DESCRIPTION OF EMBODIMENTS

To make the objectives, technical solutions, and advantages of the embodiments of the present disclosure clearer, the technical solutions in the embodiments of the present disclosure will be clearly and completely described below with reference to the accompanying drawings in the embodiments of the present disclosure. Apparently, the described embodiments are some rather than all of the embodiments of the present disclosure. All other embodiments obtained by those of ordinary skill in the art based on the embodiments of the present disclosure without creative efforts should fall within the protection scope of the present disclosure.

Terms used in the embodiments of the present disclosure are only for the purpose of describing specific embodiments, and are not intended to limit the present disclosure. Unless otherwise specified in the context, words, such as "a", "the", and "this", in a singular form in the embodiments of the present disclosure and the appended claims include plural forms.

In order to make a display region of a display panel have a through-hole, layers of the display panel in the display region are removed to form the through hole. When an encapsulation layer of the display panel is formed, there will be an encapsulation edge around the through-hole. An organic encapsulation layer in the encapsulation layer is formed by an inkjet printing technique. During inkjet printing, ink has fluidity and is ultimately solidified. However, the ink cannot be completely flat at the encapsulation edge, resulting in a large morphological fluctuation on a surface of the formed organic encapsulation layer. When a touch layer is formed on the encapsulation layer, a bridge line in the touch layer may be disposed at the location with the large morphological fluctuation on the organic encapsulation layer, causing a narrower line width and a disconnection risk to a bridge line formed by photolithography. As a result, the line functions poorly, affecting touch performance.

Embodiments of the present disclosure provide a display panel. A structure of a first touch unit adjacent to the through-hole is improved, and at least two bridge units are disposed in the first touch unit to ensure the electrical connection performance in the first touch unit and reduce the line disconnection risk.

Figure 1:
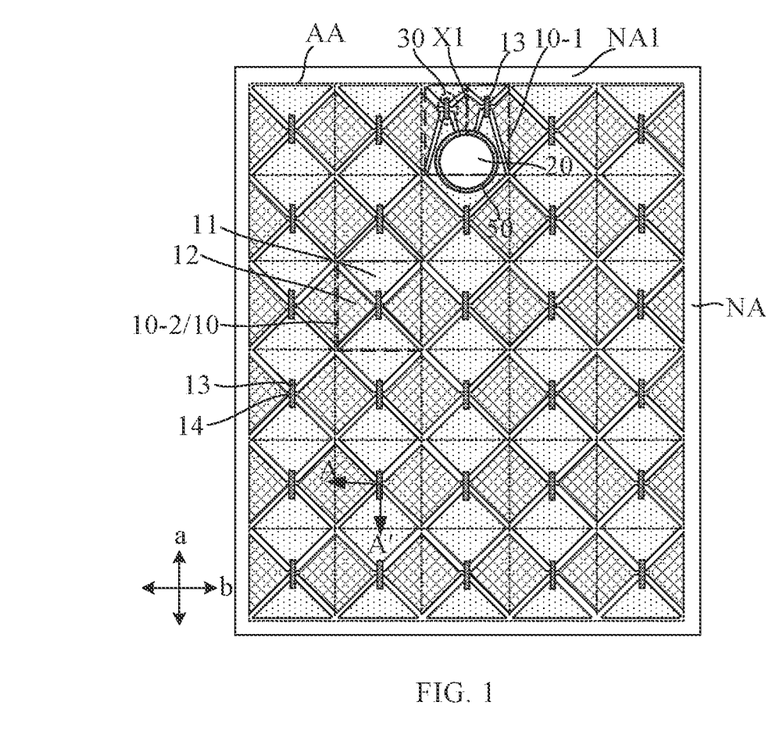
FIG. 1 is a schematic diagram of a display panel according to an embodiment of the present disclosure.
Figure 2:
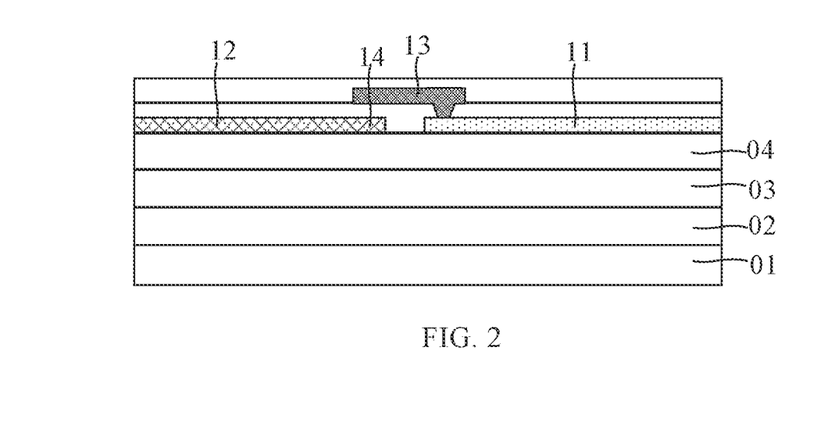
FIG. 2 is a schematic cross-sectional view taken along line A-A' shown in FIG. 1 according to an embodiment of the present disclosure.

FIG. 1 is a schematic diagram of a display panel according to an embodiment of the present disclosure. FIG. 2 is a schematic cross-sectional view taken along line A-A' shown in FIG. 1.

As shown in FIG. 1, the display panel includes a display region AA and a peripheral non-display region NA surrounding the display region AA. The display region AA includes a plurality of touch units 10, and the plurality of touch units 10 includes first electrodes 11 and second electrodes 12. The first electrodes 11 and the second electrodes 12 are disposed in a same layer. In the touch units 10, adjacent first electrodes 11 along a first direction a are connected through a bridge line 13, and adjacent second electrodes 12 along a second direction b are connected through a connecting line 14. The first direction a intersects the second direction b, and the bridge line 13 intersects the connecting line 14. In a mutual-capacitive touch detection scheme, one of the first electrode 11 and the second electrode 12 transmits a touch driving signal, while the other one of the first electrode 11 and the second electrode 12 transmits a touch sensing signal.

For example, the touch unit 10 includes two first electrodes 11 and two second electrodes 12. As shown in FIG. 1, the display region AA includes a plurality of diamond-shaped electrode blocks. For example, one electrode block is divided into two first electrodes 11, and another electrode block is divided into two second electrodes 12. The touch units 10 are arranged in an array in the display region AA. FIG. 1 schematically shows that first electrodes 11 arranged along the first direction a in the display region AA are electrically connected, and second electrodes 12 arranged along the second direction b in the display region AA are electrically connected.

As shown in FIG. 2, the bridge line 13 is disposed in a different layer from the first electrodes 11, and the connecting line 14 is disposed in a same layer as the second electrodes 12. In other words, the bridge line 13 and the first electrode 11 are formed in different manufacturing steps. The display panel includes a substrate 01, and a driver layer 02, a light-emitting device layer 03, and an encapsulation layer 04 that are located at a side of the substrate 01. The driver layer 02 includes pixel circuits. The light-emitting device layer 03 includes a plurality of light-emitting devices. The light-emitting device may be an organic light-emitting device or an inorganic light-emitting device. The encapsulation layer 04 includes at least one organic encapsulation layer and at least one inorganic encapsulation layer. The touch units are located at a side of the encapsulation layer 04 away from the substrate 01. As shown in FIG. 2, the bridge line 13 is electrically connected to the first electrode 11 through a conductive via that runs through an insulation layer. FIG. 2 illustrates an example embodiment in which the bridge line 13 is formed in a layer located at a side of a layer of the first electrode 11 away from the substrate 01. In some other embodiments, the bridge line 13 is formed in a layer located at a side of the layer of the first electrode 11 adjacent to the substrate 01.

As shown in FIG. 1, the display region AA has a through-hole 20. A second non-display region 50 surrounds the through-hole 20, and the second non-display region 50 is surrounded by the display region AA. The second non-display region 50 is provided with an encapsulation bank and some signal lines. The touch units 10 include a first touch unit 10-1 that at least partially surrounds the through-hole 20. The through-hole 20 penetrates at least part of layers of the display panel. Therefore, an area of the first touch unit 10-1 is less than an area of another touch unit 10 away from the through-hole 20. In addition, an encapsulation edge of the encapsulation layer 04 is formed around the through-hole 20. The organic encapsulation layer nearby the encapsulation edge has a large morphological fluctuation.

The first touch unit 10-1 includes N bridge units 30. Each bridge unit 30 is connected to two adjacent first electrodes 11 along the first direction a, and each bridge unit 30 includes at least one bridge line 13. N is an integer, and N≥2. The first touch unit 10-1 includes more than two first electrodes 11. FIG. 1 illustrates an example embodiment in which N=2 and each bridge unit 20 includes one bridge line 13. It may be considered that the first touch unit 10-1 includes four first electrodes 11 and three second electrodes 12. An electrode naming method for the first touch unit 10-1 is the same as an electrode naming method for the conventional touch unit 10. That is, in the first touch unit 10-1, electrodes connected by the bridge line 13 are the first electrodes 11, and electrodes connected by the connecting line 14 are the second electrodes 12. The first touch unit 10-1 includes the N bridge units 30, indicating that an electrode arrangement and electrode shape in the first touch unit 10-1 may be different from those in the conventional touch unit 10. In the display panel provided in this embodiment of the present disclosure, the display region AA is provided with the through-hole 20. The first touch unit 10-1 at least partially surrounds the through-hole 20. The first touch unit 10-1 includes N bridge units 30. The bridge unit 30 is configured to connect two first electrodes 11, and includes at least one bridge line 13. The N bridge units 30 are disposed in the first touch unit 10-1. This indicates that the N bridge lines 13 are disposed at N different locations, and the location of the bridge line 13 in the first touch unit 10-1 can be flexibly set in conjunction with the electrode arrangement and electrode shape in the first touch unit 10-1. This ensures electrical connection performance of the first touch unit and reliable touch performance around the through-hole 20. For example, the bridge line 13 can avoid or bypass the location with the large morphological fluctuation in the organic encapsulation layer in the encapsulation layer 04 around the through-hole 20, thereby ensuring that a line width of the bridge line 13 in the first touch unit 10-1 meets a design requirement, and reducing a disconnection risk of the bridge line 13. For another example, the N bridge units 30 are designed to further guarantee signal connection of the first electrode 11 in the first touch unit 10-1. If the bridge line 13 in one bridge unit 30 is disconnected, the bridge lines 13 in another bridge unit 30 can still be used for the signal transmission, thereby ensuring the reliable touch performance around the through-hole 20.

In some embodiments, as shown in FIG. 1, the plurality of touch units 10 in the display region AA are defined by horizontal dashed lines and longitudinal dashed lines, and the plurality of touch units 10 are arranged in n rows and m columns. In FIGS. 1, n=6, and m=5. The plurality of touch units 10 further includes a second touch unit 10-2 that includes two first electrodes 11 and two second electrodes 12. A distance between two adjacent bridge units 30 in the first touch unit 10-1 is $d_1$, and a distance between two bridge lines 13 respectively located in two adjacent second touch units 10-2 is $d_2$, where $d_1 < d_2$. The two adjacent second touch units 10-2 herein may be two adjacent second touch units 10-2 in a row direction, or may be two adjacent second touch units 10-2 in a column direction. For the first touch unit 10-1 defined in the present disclosure, two adjacent second touch units 10-2 should not be understood as one first touch unit 10-1. Assuming that there is no through-hole 20 at a location of the first touch unit 10-1, the area of the first touch unit 10-1 should be substantially equal to the area of the second touch unit 10-2. However, since no touch electrode is arranged in the region of the through-hole 20, the area of the first touch unit 10-1 is less than the area of the second touch unit 10-2.

FIG. 1 illustrates an example embodiment in which the two first electrodes 11 in the second touch unit 10-2 are connected through one bridge line 13. In some other embodiments, the two first electrodes 11 in the second touch unit 10-2 may be connected through at least two bridge lines 13.

Figure 3:
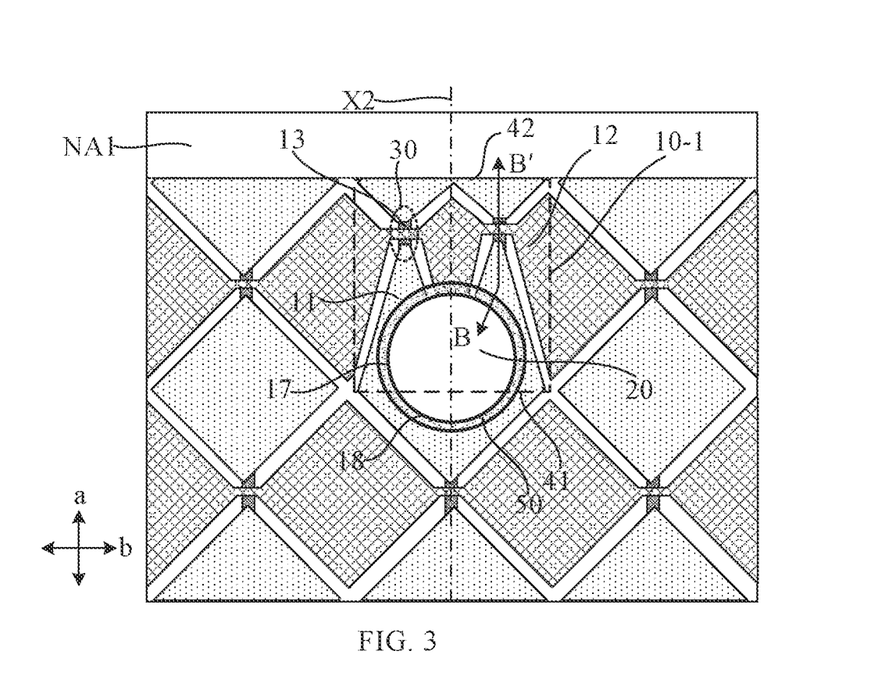
FIG. 3 is a schematic diagram of another display panel according to an embodiment of the present disclosure.

FIG. 3 is a schematic diagram of another display panel according to an embodiment of the present disclosure. FIG. 3 only shows a part of the display region, and the through-hole 20 is schematically represented by a circle. As shown in FIG. 3, the first touch unit 10-1 has a first virtual boundary 41 and a second virtual boundary 42 that are parallel to each other. The first virtual boundary 41 and the second virtual boundary 42 extend along the second direction b. The first virtual boundary 41 is truncated by the through-hole 20. The first virtual boundary 41 passes through the through-hole 20 in a top view. The N bridge units 30 are located between the through-hole 20 and the second virtual boundary 42, in other words, the N bridge units 30 are located at a same side of the through-hole 20. In this embodiment, the location of the first touch unit 10-1 relative to the through-hole 20 is designed, meeting a design requirement of setting the through-hole 20 in the display region AA. In addition, the N bridge units 30 are disposed between the through-hole 20 and the second virtual boundary 42, thereby flexibly setting the location of the bridge line 13 in the first touch unit 10-1, and reducing the line disconnection risk. This ensures the electrical connection performance of touch electrodes in the first touch unit 10-1 and the reliable touch performance around through-hole 20.

In some embodiments, as shown in FIG. 1, the peripheral non-display region NA surrounds the display region AA. The peripheral non-display region NA includes a first non-display region NA1. The first touch unit 10-1 is adjacent to the first non-display region NA1, and the N bridge units 30 are located between the through-hole 20 and the first non-display region NA1. In this embodiment, an encapsulation edge exists around the through-hole 20, and another encapsulation edge exists at a boundary between the first non-display region NA1 and the display region AA. Therefore, there is a region with the large morphological fluctuation in the organic encapsulation layer between the through-hole 20 and the first non-display region NA1, which affects a yield of the bridge line 13 formed by photolithography. If the touch unit 10 between the through-hole 20 and the first non-display region NA1 adopts a conventional design, the disconnection risk of the bridge line 13 is very high. However, based on the design in this embodiment of the present disclosure, the first touch unit 10-1 includes N bridge units 30. In this regard, the bridge lines 13 are disposed at N different locations, and the locations of the bridge lines 13 in the first touch unit 10-1 may be flexibly designed in conjunction with the electrode arrangement and electrode shape in the first touch unit 10-1. In this way, the bridge line avoids the region with the large morphological fluctuation in the organic encapsulation layer, the disconnection risk of the bridge line 13 is reduced, and the reliable touch performance around through-hole 20 is ensured.

As shown in FIG. 1, there is a first virtual line segment X1 between the through-hole 20 and the first non-display region NA1, and a length of the first virtual line segment X1 is a shortest distance between the through-hole 20 and the first non-display region NA1. Since one encapsulation edge is around the through-hole 20 and another encapsulation edge is at the boundary between the first non-display region NA1 and the display region AA, the first virtual line segment X1 is in a region with a largest morphological fluctuation in the organic encapsulation layer. FIG. 1 is a top view of the display panel. The top view is taken in a direction perpendicular to a plane of the substrate 01. As shown in FIG. 1, along the direction perpendicular to the plane of the substrate 01, at least one bridge unit 30 does not overlap the first virtual line segment X1. The expression the bridge unit 30 does not overlap the first virtual line segment X1 means that the bridge line 13 in the bridge unit 30 does not overlap the first virtual line segment X1. In this way, at least one bridge unit 30 in the first touch unit 10-1 can avoid the region with the large morphological fluctuation in the organic encapsulation layer, thereby ensuring the yield of the bridge line 13 in the bridge unit 30, reducing the disconnection risk of the bridge line 13, and ensuring the reliable touch performance around through-hole 20.

Figure 4:
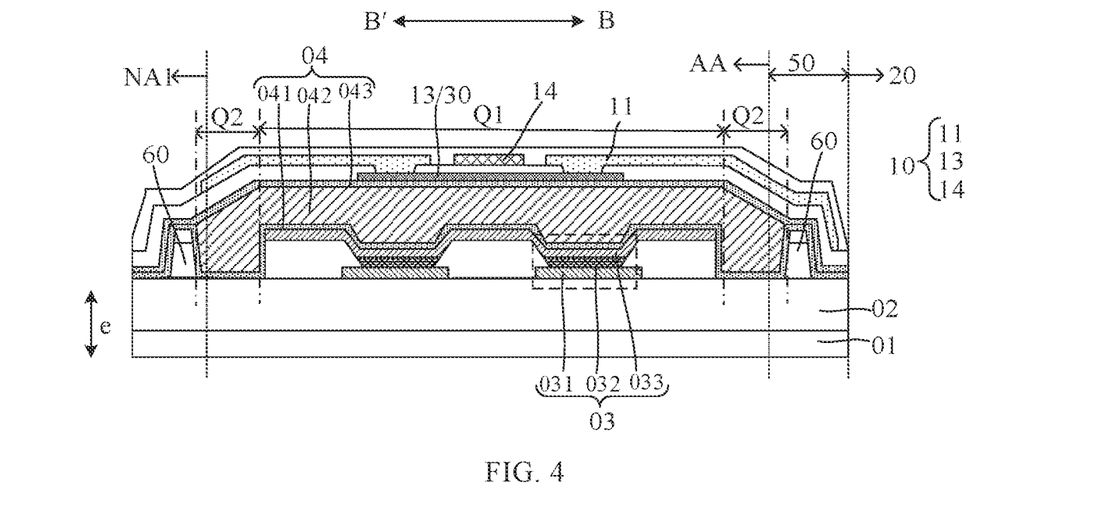
FIG. 4 is a schematic cross-sectional view taken along line B-B' shown in FIG. 3 1 according to an embodiment of the present disclosure.

FIG. 4 is a schematic cross-sectional view taken along line B-B' shown in FIG. 3. In FIG. 4, the layer structure of the display panel is simplified. With reference to FIG. 3, the second non-display region 50 surrounds the through-hole 20 and is surrounded by the display region, and the first touch unit 10-1 is adjacent to the first non-display region NA1. As shown in FIG. 4, the display panel includes a substrate 01, a driver layer 02 located at a side of the substrate 01, a light-emitting device 030 located at a side of the driver layer 02 away from the substrate 01, and an encapsulation layer 04 located at a side of the light-emitting device 030 away from the substrate 01. The light-emitting device 030 includes a first electrode 031, a light-emitting layer 032, and a second electrode 033 that are stacked. The touch units 10 are located at a side of the encapsulation layer 04 away from the light-emitting device layer 03. The encapsulation layer 04 includes a first inorganic layer 041, an organic encapsulation layer 042, and a second inorganic layer 043. The encapsulation layer 04 includes a flat region Q1 and a sloping region Q2. The sloping region Q2 has a different surface height from the flat region Q1, resulting in a morphological fluctuation on a surface of the encapsulation layer 04. The morphological fluctuation on the surface of the encapsulation layer 04 is caused by a morphological fluctuation on the surface of the organic encapsulation layer 042. As shown in FIG. 4, an encapsulation bank 60 is disposed in the second non-display region 50, and the sloping region Q2 at a side of the encapsulation layer 04 adjacent to the through-hole 20 is partially located in the display region AA and partially located in the second non-display region 50. The encapsulation bank 60 is also disposed in the first non-display region NA1, and the sloping region Q2 at a side of the encapsulation layer 04 adjacent to the first non-display region NA1 is partially located in the display region AA and partially located in the first non-display region NA1. As shown in FIG. 4, the sloping region Q2 of the encapsulation layer 04 exists both at the boundary between the first non-display region NA1 and the display region AA, and nearby the second non-display region 50 around the through-hole 20. In other words, the surface of the encapsulation layer 04 morphologically fluctuates in a region between the first non-display region NA1 and the through-hole 20. The morphological fluctuation of the encapsulation layer 04 affects the yield of the bridge line above the encapsulation layer 04.

With reference to FIG. 3 and FIG. 4, along the direction e perpendicular to the plane of the substrate 01, at least one bridge unit 30 overlaps with the flat region Q1. This setting can ensure a high yield for the bridge line 13 formed by photolithography in the at least one bridge unit 30, thereby reducing the disconnection risk of the bridge line 13, and ensuring the reliable touch performance around through-hole 20.

In addition, as shown in FIG. 4, the layer of the bridge line 13 is located at the side of the layer of the first electrode 11 adjacent to the substrate 01.

An example in which the display panel is rectangular is used. The long edge of the display panel extends along the first direction a, and the short edge of the display panel extends along the second direction b. For example, in the embodiment of FIG. 1, N=2. Accordingly, the first touch unit 10-1 includes four first electrodes 11 and three second electrodes 12.

Figure 5:
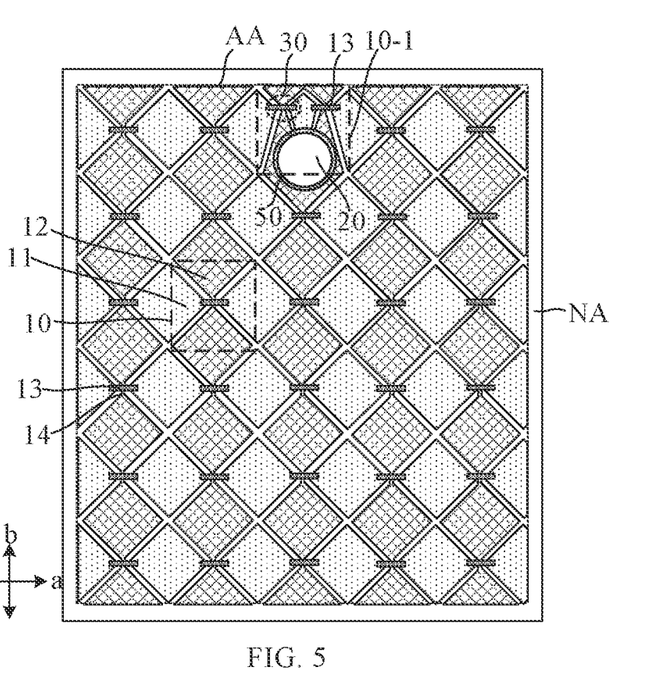
FIG. 5 is a schematic diagram of another display panel according to an embodiment of the present disclosure.

In some other embodiments, N=2, the long edge of the rectangular display panel extends along the second direction b, and the short edge of the display panel extends along the first direction a. The first touch unit 10-1 includes four second electrodes 12 and three first electrodes 11. FIG. 5 is a schematic diagram of another display panel according to an embodiment of the present disclosure. As shown in FIG. 5, the display region AA includes a plurality of touch units 10, and the plurality of touch units 10 includes first electrodes 11 and second electrodes 12 that are disposed in the same layer. In the plurality of touch units 10, adjacent first electrodes 11 along the first direction a are connected through the bridge line 13, and adjacent second electrodes 12 along the second direction b are connected through the connecting line 14. The first direction a intersects the second direction b. The first touch unit 10-1 includes two bridge units 30. The bridge unit 30 connects two adjacent first electrodes 11 along the first direction a, and each bridge unit 30 includes at least one bridge line 13. In this embodiment, the bridge lines 13 are disposed at N different locations, and the locations of the bridge lines 13 in the first touch unit 10-1 can be flexibly set in conjunction with the electrode arrangement and electrode shape in the first touch unit 10-1. In this way, the bridge line 13 avoids the region with the large morphological fluctuation in the organic encapsulation layer, thereby reducing the disconnection risk of the bridge line 13, and ensuring the reliable touch performance around through-hole 20.

In some embodiments, as shown in FIG. 3, the display panel has a second virtual axis X2, and the through-hole 20 is symmetrical about the second virtual axis X2 in a top view. For example, a contour of the through-hole 20 is symmetrical about the second virtual axis X2. For example, when the through-hole 20 is in a circle in the top view, the circle is symmetrical about the second virtual axis X2. N=2, and two bridge units 30 are respectively located at two sides of the second virtual axis X2. The large morphological fluctuation in the organic encapsulation layer around through-hole 20 occurs at a location of the second virtual axis X2. Especially when the first touch unit 10-1 is adjacent to the first non-display region NA1, the edge of the organic encapsulation layer exists at the boundary between the first non-display region NA1 and the display region AA and also surrounds the through-hole 20, causing an especially large morphological fluctuation at the location of the second virtual axis X2, and affecting a width of a line formed by photolithography. However, in the embodiments of the present disclosure, two bridge units 30 are disposed located at the two sides of the second virtual axis X2 respectively. In this way, the bridge line 13 in the bridge unit 30 can avoid the region with the large morphological fluctuation in the organic encapsulation layer, thereby ensuring the yield of the bridge line 13 formed by photolithography, reducing the disconnection risk of the bridge line 13, and ensuring the reliable touch performance around through-hole 20.

With reference to FIG. 1 and FIG. 3, in some embodiments, the first virtual line segment X1 is a partial line segment of the second virtual axis X2, or the first virtual line segment X1 coincides with the second virtual axis X2.

In some embodiments, as shown in FIG. 3, in the first touch unit 10-1, first electrodes 11 located at two sides of the second virtual axis X2 are symmetrical about the second virtual axis X2, and second electrodes 12 located at two sides of the second virtual axis X2 are symmetrical about the second virtual axis X2. In this embodiment, N=2. The two bridge units 30 are respectively located at two sides of the second virtual axis X2. The bridge line 13 in the bridge unit 30 can avoid the region with the large morphological fluctuation in the organic encapsulation layer, thereby ensuring the yield of the bridge line 13 formed by photolithography, and reducing the disconnection risk of the bridge line 13. In addition, both the first electrodes 11 and the second electrodes 12 in the first touch unit 10-1 are in a symmetrical design, meeting a design rule of uniformity. When the touch unit is formed by etching, yields of the first electrode 11 and the second electrode 12 that are formed by etching can be ensured. In addition, touch detection performances at different locations in the first touch unit 10-1 have little difference. The design of the first touch unit 10-1 has a small impact on complexity of detection signal processing in touch detection process, and thus has a small impact on sensitivity of touch detection.

The symmetrical design can be adopted for a structure of the first touch unit 10-1 in the embodiment of FIG. 3, and the design in which the electrodes are symmetrical about the second virtual axis X2 can be also adopted for the first touch unit 10-1 in the embodiment of FIG. 5.

Figure 6:
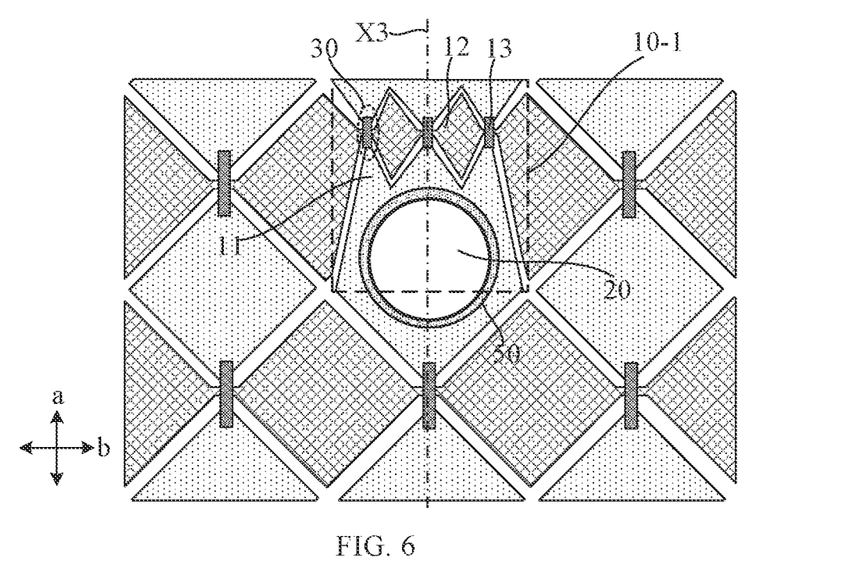
FIG. 6 is a partial schematic view of another display panel according to an embodiment of the present disclosure.

FIG. 6 is a partial schematic diagram of another display panel according to an embodiment of the present invention. For example, N=3. As shown in FIG. 6, in some embodiments, the display panel has a third virtual axis X3. For example, the third virtual axis X3 intersects the through-hole 20 in the top view. First electrodes 11 located at two sides of the third virtual axis X3 in the first touch unit 10-1 are symmetrical about the third virtual axis X3, and second electrodes 12 located at the two sides of the third virtual axis X3 in the first touch unit 10-1 are symmetrical about the third virtual axis X3. In other words, the N bridge units 30 are uniformly distributed in their arrangement direction. In this embodiment, both the first electrodes 11 and the second electrodes 12 in the first touch unit 10-1 are designed symmetrically, meeting the design rule of the uniformity. When the touch unit is formed by etching, the yields of the first electrode 11 and the second electrode 12 that are formed by etching can be ensured. In addition, the touch detection performances at the different locations in the first touch unit 10-1 are basically the same. The design of the first touch unit 10-1 has a small impact on the complexity of the detection signal processing in the touch detection process, and thus has the small impact on the sensitivity of the touch detection.

As shown in FIG. 6, when N=3, one of the bridge units 30 overlaps with the third virtual axis X3. In this embodiment, three bridge units 30 are disposed, thereby adding signal transmitting paths. If the bridge line 13 in one bridge unit 30 is disconnected, the bridge lines 13 in other bridge units 30 can still be used for the signal transmission, thereby ensuring the reliable touch performance around the through-hole 20.

In the embodiment with N=2, when the contour of the through-hole 20 is symmetrical about the third virtual axis X3, the two bridge units 30 are respectively disposed on the two sides of the third virtual axis X3. The third virtual axis X3 coincides with the second virtual axis X2 in the above embodiment.

Figure 7:
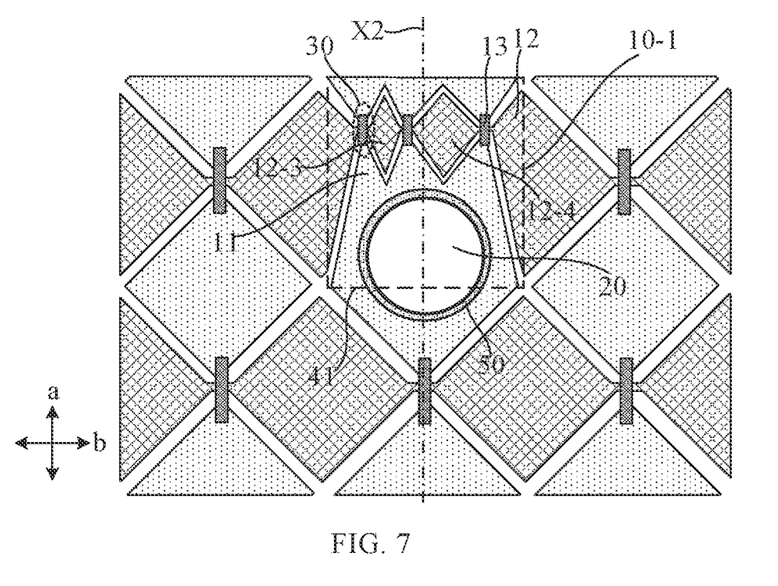
FIG. 7 is a partial schematic view of another display panel according to an embodiment of the present disclosure.

FIG. 7 is a partial schematic diagram of another display panel according to an embodiment of the present disclosure. As shown in FIG. 7, N=3, in other words, the first touch unit 10-1 includes three bridge units 30. The display panel has the second virtual axis X2. The contour of the through-hole 20 is symmetrical about the second virtual axis X2. In this regard, the through-hole 20 is symmetrical about the second virtual axis X2 in the top view. One of three bridge units 30 is located at one side of the second virtual axis X2, and the other two of the three bridge units 30 are located at the other side of the second virtual axis X2. The large morphological fluctuation in the organic encapsulation layer around through-hole 20 occurs at the location of the second virtual axis X2. Especially when the first touch unit 10-1 is adjacent to the first non-display region NA1, at the boundary region between the first non-display region NA1 and the display region AA and at the edge of the organic encapsulation layer around through-hole 20, the particularly large morphological fluctuation occurs at the location of the second virtual axis X2, affecting the width of the line formed by photolithography. When N=3, the three bridge units 30 are disposed at the two sides of the second virtual axis X2. In this way, the bridge line 13 in the bridge unit 30 can avoid the region with the large morphological fluctuation in the organic encapsulation layer, thereby ensuring the yield of the bridge line 13 formed by photolithography, reducing the disconnection risk of the bridge line 13, and ensuring the reliable touch performance around through-hole 20.

Figure 8:
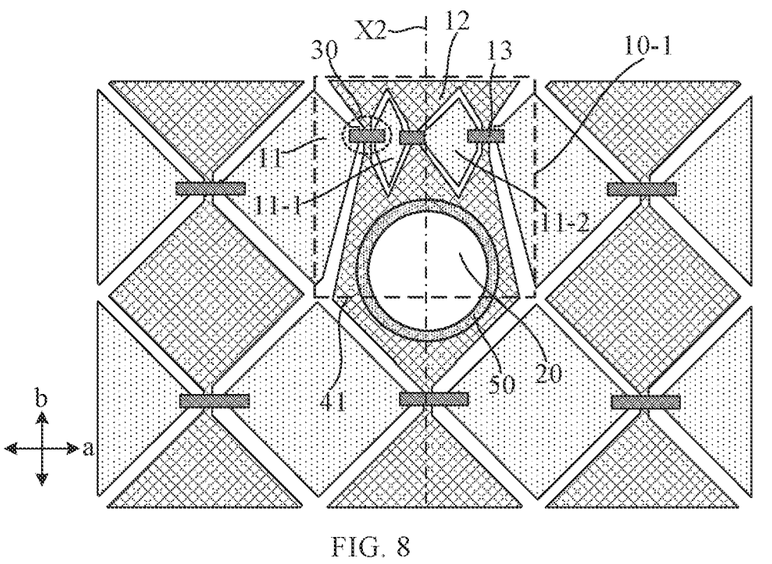
FIG. 8 is a partial schematic view of another display panel according to an embodiment of the present disclosure.

FIG. 8 is a partial schematic diagram of another display panel according to an embodiment of the present disclosure. As shown in FIG. 8, in some embodiments, the first electrodes 11 of the first touch unit 10-1 include a first sub-electrode 11-1 and a second sub-electrode 11-2. Each of the first sub-electrode 11-1 and the second sub-electrode 11-2 is located between two adjacent bridge units 30 and is at least partially surrounded by four second electrodes 12. An area of the first sub-electrode 11-1 is $S_1$, an area of the second sub-electrode 11-2 is $S_2$, and $S_1 > S_2$, and $(S_1 - S_2)/S_2 \leq 0.1$. In this embodiment, the through-hole 20 is surrounded by the second electrodes 12, and the first virtual boundary 41 extends along the first direction a and passes through the through-hole 20 in the top view. When N=3, the first touch unit 10-1 includes the first sub-electrode 11-1 and the second sub-electrode 11-2 each of which is surrounded by the second electrodes 12. The first sub-electrode 11-1 and the second sub-electrode 11-2 basically have the same area or have a small difference in area, such that the touch detection capacitance formed by the first sub-electrode 11-1 and the second electrode 12 and the touch detection capacitance formed by the second sub-electrode 11-2 and the second electrode 12 are basically the same. This ensures a uniform touch detection performance at different locations in the first touch unit 10-1. The design of the first touch unit 10-1 has a small impact on the complexity of the detection signal processing in the touch detection process.

In some embodiments, as shown in FIG. 7, the second electrodes 12 in the first touch unit 10-1 include a third sub-electrode 12-3 and a fourth sub-electrode 12-4. Each of the third sub-electrode 12-3 and the fourth sub-electrode 12-4 is located between two adjacent bridge units 30 and is at least partially surrounded by four first electrodes 11. An area of the third sub-electrode 12-3 is $S_3$, an area of the fourth sub-electrode 12-4 is $S4$, and $S_3 > S_4$, and $(S_3 - S_4)/S_3 \leq 0.1$. In this embodiment, the through-hole 20 is surrounded by the first electrodes 11, and the first virtual boundary 41 extends along the second direction b and passes through the through-hole 20. When N=3, the first touch unit 10-1 includes the third sub-electrode 12-3 and the fourth sub-electrode 12-4 each is surrounded by the first electrodes 11. The third sub-electrode 12-3 and the fourth sub-electrode 12-4 basically have the same area or have a small difference in area, such that there is a little difference between touch detection capacitance formed by the third sub-electrode 12-3 and the first electrode 11 and touch detection capacitance formed by the fourth sub-electrode 12-4 and the first electrode 11. This ensures a uniform touch detection performance at different locations in the first touch unit 10-1. The design of the first touch unit 10-1 has a small impact on the complexity of the detection signal processing in the touch detection process.

In some embodiments, as shown in FIG. 3, the display panel has the second virtual axis X2, the contour of the through-hole 20 is symmetrical about the second virtual axis X2, and the second virtual axis X2 extends along the first direction a. The second virtual axis X2 passes through the through-hole 20 in the top view. In the first touch unit 10-1, at least one second electrode 12 each is located between two adjacent bridge units 30 and at least partially surrounded by four first electrodes 11. An overall arrangement of the plurality of touch units 10 in the display region AA in this embodiment may be described with reference to FIG. 1. First electrodes 11 in multiple touch units 10 arranged along the first direction a are electrically connected to each other, and second electrodes 12 in multiple touch units 10 arranged along the second direction b are electrically connected to each other. The second virtual axis X2 extends along the first direction a. Any one of the N bridge units 30 can be used as the signal transmitting path of the first electrodes 11. The first touch unit 10-1 includes N bridge units 30, so the signal transmission of the first electrodes 11 in the first touch unit 10-1 is guaranteed. If the bridge line 13 in one bridge unit 30 is disconnected, the bridge lines 13 in other bridge units 30 can still be used for the signal transmission, thereby ensuring the reliable touch performance around the through-hole 20.

In some embodiments, as shown in FIG. 8, the display panel has the second virtual axis X2, the contour of the through-hole 20 is symmetrical about the second virtual axis X2, and the second virtual axis X2 extends along the second direction b. In the first touch unit 10-1, at least one first electrode 11 each is located between two adjacent bridge units 30 and at least partially surrounded by four second electrodes 12. The overall arrangement of the plurality of touch units 10 in the display region AA in this embodiment may be described with reference to FIG. 5. The first electrodes 11 in the touch units 10 arranged along the first direction a are electrically connected to each other, and the second electrodes 12 in the touch units 10 arranged along the second direction b are electrically connected to each other. The second virtual axis X2 extends along the second direction b. All the N bridge units 30 are used as the signal transmitting paths of the first electrodes 11. The first touch unit 10-1 includes N bridge units 30, and the locations of the bridge lines 13 in the first touch unit 10-1 can be flexibly set in conjunction with the designed electrode arrangement and electrode shape in the first touch unit 10-1. In this way, the bridge line 13 can avoid the region with the large morphological fluctuation in the organic encapsulation layer in the encapsulation layer around the through-hole 20. This ensures that the line width of the bridge line 13 in the first touch unit 10-1 meets the design requirement, reduces the disconnection risk of the abridge line 13, and ensures the reliable touch performance around through-hole 20.

In this embodiment of the present disclosure, the first touch unit 10-1 includes the N bridge units 30, which will increase a value of touch detection capacitance in the first touch unit 10-1. In this embodiment of the present disclosure, the structure of the first touch unit 10-1 is further designed to reduce the value of the touch detection capacitance in the first touch unit 10-1.

Figure 9:
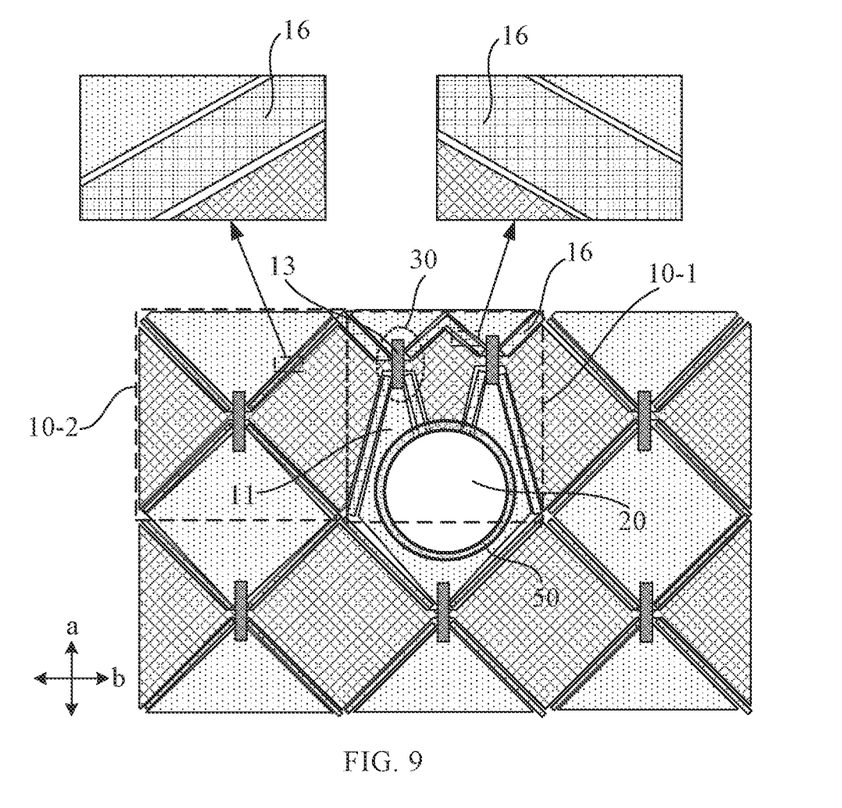
FIG. 9 is a schematic diagram of another display panel according to an embodiment of the present disclosure.

FIG. 9 is a schematic diagram of another display panel according to an embodiment of the present disclosure. FIG. 9 shows simplified structures of the first touch unit 10-1 and the second touch unit 10-2. For example, N=2. As shown in FIG. 9, a dummy electrode 16 is disposed between the first electrode 11 and the second electrode 12 adjacent to the first electrode 11 in the touch unit 10, and the dummy electrode is located in a same layer as the first electrode 11 and the second electrode 12. A width of each of at least one dummy electrode 16 in the first touch unit 10-1 is greater than a width of the dummy electrode 16 in the second touch unit 10-2. Since the width of each of at least one dummy electrodes 16 in the first touch unit 10-1 is larger, a spacing between the adjacent first electrode 11 and second electrode 12 with the dummy electrode 16 arranged between the first electrode 11 and the second electrode 12 has an increased width. This can reduce touch detection capacitance formed between the first electrode 11 and the second electrode 12, thereby reducing a touch detection capacitance difference between the first touch unit 10-1 and the second touch unit 10-2, and improving reliability of the touch detection.

It should be noted that the first electrode 11, the second electrode 12, and the dummy electrode 16 in FIG. 9 are only simplified for illustration. In some embodiments, the electrode in the touch unit 10 is a grid-shaped electrode. Taking the first electrode 11 as an example, the grid-shaped first electrode 11 includes a plurality of hollowed portions/openings to expose the light-emitting devices in the light-emitting device layer. The first electrode 11 is made of a metal material, and the hollowed portion is designed to ensure light exiting efficiency of the light-emitting device.

Figure 10:
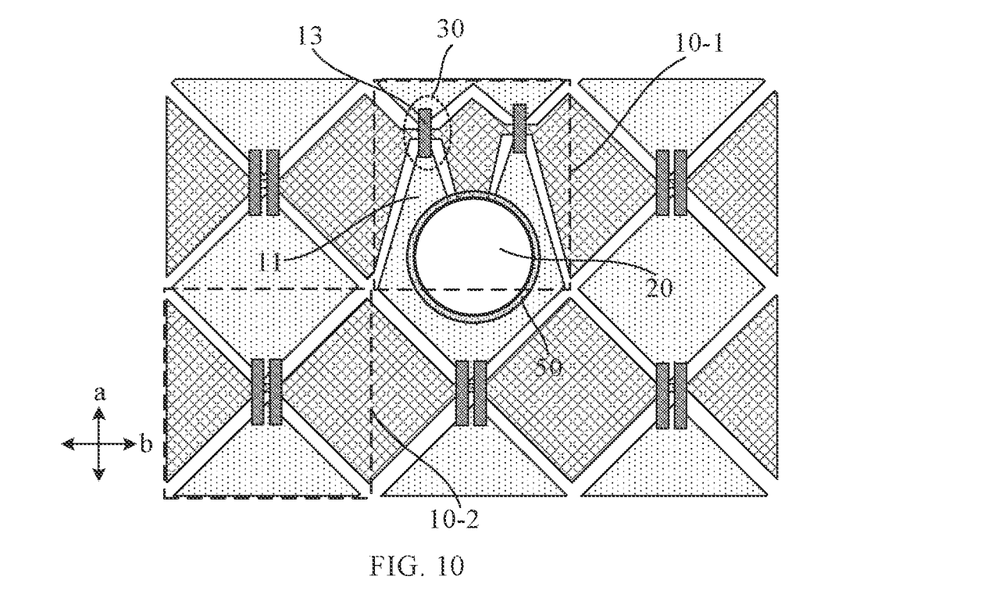
FIG. 10 is a partial schematic view of another display panel according to an embodiment of the present disclosure.

In some other embodiments, two adjacent first electrodes 11 in the second touch unit are connected through n bridge lines 13, and n is a positive integer. The bridge unit includes m bridge lines 13, and m is a positive integer and less than n. FIG. 10 is a partial schematic diagram of another display panel according to an embodiment of the present disclosure. For example, N=2. As shown in FIG. 10, the bridge unit 30 in the first touch unit 10-1 includes one bridge line 13, and the second touch unit 10-2 includes two bridge lines 13. This setting can reduce capacitance generated at an intersection between the bridge line 13 and the connecting line in the first touch unit 10-1, to reduce the value of the touch detection capacitance in the first touch unit 10-1 and reduce the touch detection capacitance difference between the first touch unit 10-1 and the second touch unit 10-2.

In some embodiments, as shown in FIG. 3, a contour edge of the through-hole 20 in the top view includes a first edge 17 and a second edge 18 that are connected end to end, and a length of the first edge 17 is greater than a length of the second edge 18. For example, a first end of the first edge 17 is connected to a first end of the second edge 18, and a second end of the first edge 17 is connected to a second end of the second edge 18. The first touch unit 10-1 is disposed around the first edge 17. As shown in FIG. 3, the through-hole 20 affects the two touch units 10 in the display region, and a most part of the through-hole 20 is surrounded by the first touch unit 10-1. Therefore, the through-hole 20 affects the yield of the bridge line 13 in the first touch unit 10-1. To improve the yield of the bridge line 13 in the first touch unit 10-1, the first touch unit 10-1 includes N bridge units 30 in the embodiments of the present disclosure. In this way, the bridge lines 13 may be disposed at N different locations, and the location of the bridge line 13 in the first touch unit 10-1 can be flexibly set in conjunction with the designed electrode arrangement and electrode shape in the first touch unit 10-1. This ensures the electrical connection performance of the line in the first touch unit, reduces the line disconnection risk, and ensures the reliable touch performance around the through-hole 20.

Figure 11:
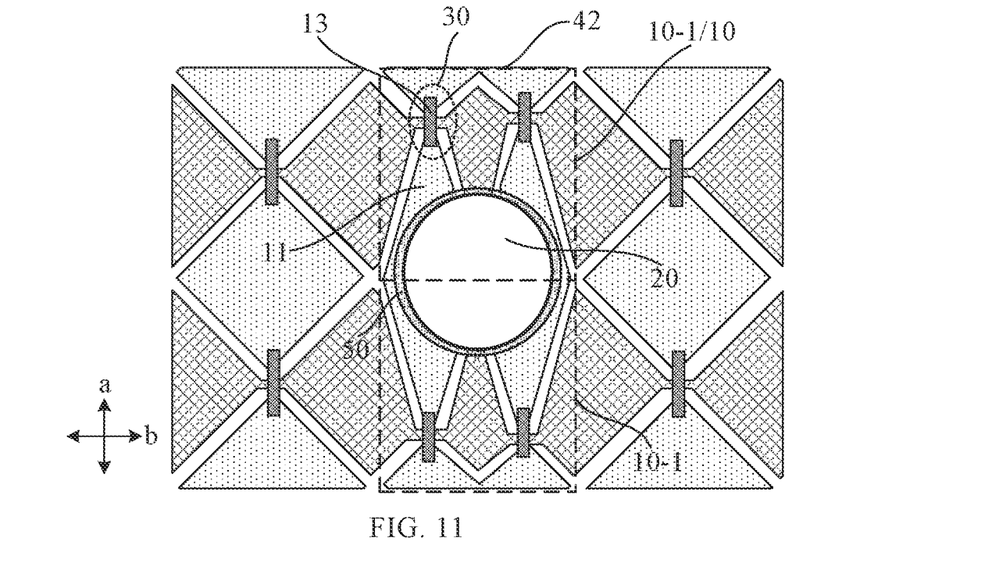
FIG. 11 is a partial schematic view of another display panel according to an embodiment of the present disclosure.

FIG. 11 is a partial schematic diagram of another display panel according to an embodiment of the present disclosure. In some embodiments, as shown in FIG. 11, the plurality of touch units 10 include two adjacent first touch units 10-1. One part of the contour edge of the through-hole 20 is surrounded by one first touch unit 10-1, and the other part of the contour edge is surrounded by the other first touch unit 10-1. In this embodiment, the through-hole 20 is surrounded by two touch units 10, and the two touch units 10 are the first touch units 10-1. The location of the bridge line 13 in the first touch unit 10-1 can be flexibly set in conjunction with the designed electrode arrangement and electrode shape in the first touch unit 10-1. This ensures the electrical connection performance of the line in the first touch unit 10-1 and the reliable touch performance around the through-hole 20.

Figure 12:
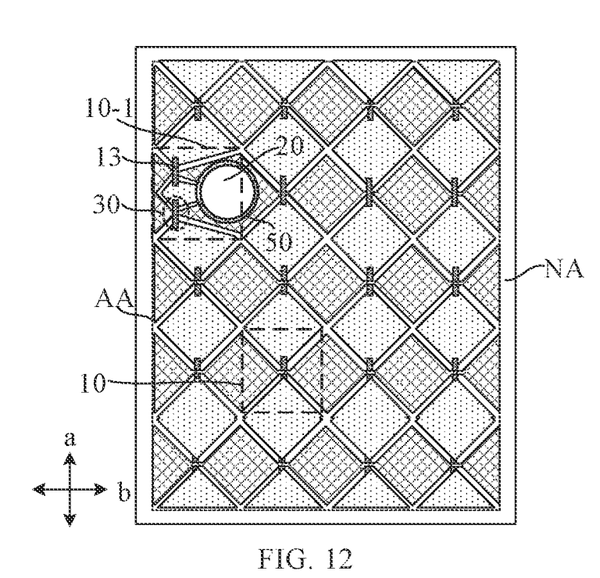
FIG. 12 is a schematic diagram of another display panel according to an embodiment of the present disclosure.

As shown in FIG. 1, the through-hole 20 is located at an upper portion of the display region AA. FIG. 12 is a schematic diagram of another display panel according to an embodiment of the present disclosure. In some other embodiments, as shown in FIG. 12, the through-hole 20 is located in a top left corner of the display region AA.

Figure 13:
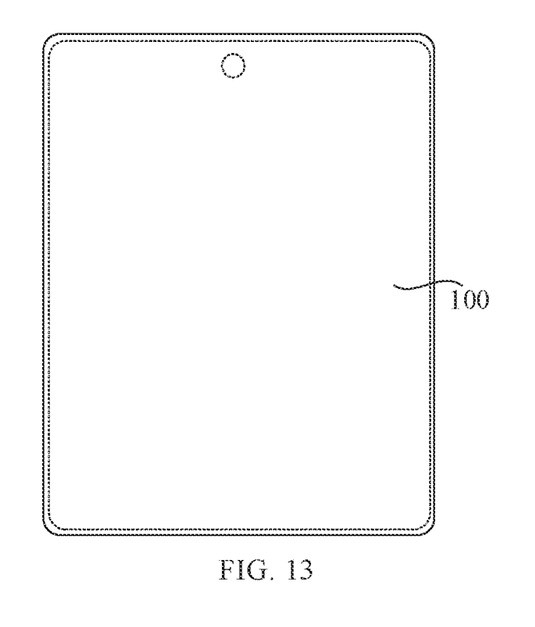
FIG. 13 is a schematic diagram of a display apparatus according to an embodiment of the present disclosure.

An embodiment of the present disclosure further provides a display apparatus. FIG. 13 is a schematic diagram of a display apparatus according to an embodiment of the present disclosure. As shown in FIG. 13, the display apparatus includes the display panel 100 according to any embodiment of the present disclosure. The structure of the display panel 100 has been described in the foregoing embodiments, and details are not repeated. The display apparatus provided by the embodiment of the present disclosure may be an electronic product such as a mobile phone, a tablet computer, a television, a notebook computer, or an intelligent wearable product.

The above descriptions are merely exemplary embodiments of the present disclosure, and are not intended to limit the present disclosure. Any modifications, equivalent replacements, improvements, and the like made within the spirit and principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions of the embodiments of the present disclosure.

What is claimed is:

1. A display panel comprising: a plurality of touch units located in a display region of the display panel, wherein the plurality of touch units comprises first electrodes and second electrodes that are disposed in a same layer, wherein, in the plurality of touch units, adjacent first electrodes along a first direction are connected through a bridge line, and adjacent second electrodes along a second direction are connected through a connecting line, the first direction intersects the second direction, the bridge line is disposed in a different layer from the first electrodes, and the connecting line is disposed in a same layer as the second electrodes, wherein the display region comprises a through-hole, the plurality of touch units comprises a first touch unit that at least partially surrounds the through-hole, wherein the first touch unit comprises N bridge units, each bridge unit is connected between two adjacent first electrodes along the first direction, and at least one of the bridge units each comprises at least one bridge line, where N is an integer and N>2, and wherein the plurality of touch units further comprises second touch units each comprising two first electrodes and two second electrodes, an area occupied by the first touch unit and an area occupied by each of the second touch units being equal to each other, and the number of the first electrodes in the first touch unit is greater than the number of the first electrodes in each of the second touch units.

2. The display panel according to claim 1, wherein the first touch unit comprises a first virtual boundary and a second virtual boundary that are parallel to each other, the first virtual boundary passes through the through-hole in a top view, and the N bridge units are located between the through-hole and the second virtual boundary.

3. The display panel according to claim 1, further comprising a peripheral non-display region that surrounds the display region, wherein the peripheral non-display region comprises a first non-display region, the first touch unit is adjacent to the first non-display region, and the N bridge units are located between the through-hole and the first non-display region.

4. The display panel according to claim 3, further comprising: a substrate, a light-emitting device located at a side of the substrate, and an encapsulation layer located at a side of the light-emitting device away from the substrate, wherein the plurality of touch units is located at a side of the encapsulation layer away from the light-emitting device, wherein a first virtual line segment is located between the through-hole and the first non-display region, and a length of the first virtual line segment is a shortest distance between the through-hole and the first non-display region, and wherein, in a direction perpendicular to a plane of the substrate, at least one of the bridge units does not overlap with the first virtual line segment.

5. The display panel according to claim 1, further comprising: a substrate, a light-emitting device located at a side of the substrate, and an encapsulation layer located at a side of the light-emitting device away from the substrate, wherein the plurality of touch units is located at a side of the encapsulation layer away from the light-emitting device, wherein the encapsulation layer comprises a flat region and a sloping region, and wherein, in a direction perpendicular to a plane of the substrate, at least one of the bridge units overlaps with the flat region.

6. The display panel according to claim 1, wherein the display panel comprises a second virtual axis, and the through-hole is symmetrical about the second virtual axis in a top view, and wherein N=2, and the two bridge units are respectively located at two sides of the second virtual axis.

7. The display panel according to claim 6, wherein in the first touch unit, the first electrodes located at two sides of the second virtual axis are symmetrical about the second virtual axis, and the second electrodes located at two sides of the second virtual axis are symmetrical about the second virtual axis.

8. The display panel according to claim 1, wherein the display panel comprises a second virtual axis, and the through-hole is symmetrical about the second virtual axis in a top view, and wherein N=3, one of three bridge units is located at one side of the second virtual axis, and the other two of the three bridge units are located at the other side of the second virtual axis.

9. The display panel according to claim 8, wherein, in the first touch unit, one first electrode comprises a first sub-electrode and a second sub-electrode, each of the first sub-electrode and the second sub-electrode are located between two adjacent bridge units and are at least partially surrounded by four second electrodes, and an area $S_1$ of the first sub-electrode and an area $S_2$ of the second sub-electrode satisfy $S_1 > S_2$, and $(S_1 - S_2)/S_2 \leq 0.1$.

10. The display panel according to claim 8, wherein, in the first touch unit, one second electrode comprises a third sub-electrode and a fourth sub-electrode, each of the third sub-electrode and the fourth sub-electrode is located between two adjacent bridge units and is at least partially surrounded by four first electrodes, and an area $S_3$ of the third sub-electrode and an area $S_4$ of the fourth sub-electrode satisfy $S_3 > S_4$, and $(S_3 - S_4)/S_3 \leq 0.1$.

11. The display panel according to claim 1, wherein the display panel comprises a third virtual axis that intersects the through-hole in a top view, first electrodes located at two sides of the third virtual axis in the first touch unit are symmetrical about the third virtual axis, and second electrodes located at two sides of the third virtual axis in the first touch unit are symmetrical about the third virtual axis.

12. The display panel according to claim 1, wherein the display panel comprises a second virtual axis, the through-hole is symmetrical about the second virtual axis in a top view, and the second virtual axis extends along the first direction, and wherein, in the first touch unit, at least one second electrode each is located between two adjacent bridge units and at least partially surrounded by four first electrodes.

13. The display panel according to claim 1, wherein the display panel comprises a second virtual axis, the through-hole is symmetrical about the second virtual axis in a top view, and the second virtual axis extends along the second direction, and
  wherein, in the first touch unit, at least one first electrode each is located between two adjacent bridge units and at least partially surrounded by four second electrodes.

14. The display panel according to claim 1, wherein each touch unit comprises dummy electrodes, each of which is located between the first electrode and the second electrode that are adjacent in the touch unit,
  wherein the plurality of touch units further comprises a second touch unit, and
  wherein a width of at least one of the dummy electrodes in the first touch unit is greater than a width of the dummy electrode in the second touch unit.

15. The display panel according to claim 1, wherein the plurality of touch units further comprises a second touch unit, and two adjacent first electrodes in the second touch unit are connected through n bridge lines, where n is a positive integer, and
  wherein the bridge unit comprises m bridge lines, where m is a positive integer, and m<n.

16. The display panel according to claim 1, wherein, in a top view, a contour edge of the through-hole comprises a first edge and a second edge, a first end of the first edge is connected to a first end of the second edge, and a second end of the second edge is connected to a second end of the first edge, and wherein a length of the first edge is greater than a length of the second edge, and the first touch unit is disposed around the first edge.

17. The display panel according to claim 1, wherein the plurality of touch units comprises two adjacent first touch units, wherein in a top view, one part of a contour edge of the through-hole is surrounded by one of the two first touch units, the other part of the contour edge of the through-hole is surrounded by the other one of the two first touch units.

18. The display panel according to claim 1, wherein touch units of the plurality of touch units are arranged in n rows and m columns, and
  wherein a distance $d_1$ between two adjacent bridge units in the first touch unit and a distance $d_2$ between two bridge lines respectively located in two adjacent second touch units satisfy $d_1<d_2$.

19. A display apparatus, comprising a display panel, wherein the display panel comprises: a plurality of touch units located in a display region of the display panel, wherein the plurality of touch units comprises first electrodes and second electrodes that are disposed in a same layer, wherein, in the plurality of touch units, adjacent first electrodes along a first direction are connected through a bridge line, and adjacent second electrodes along a second direction are connected through a connecting line, the first direction intersects the second direction, the bridge line is disposed in a different layer from the first electrodes, and the connecting line is disposed in a same layer as the second electrodes, wherein the display region comprises a through-hole, the plurality of touch units comprises a first touch unit that at least partially surrounds the through-hole, wherein the first touch unit comprises N bridge units, each bridge unit is connected between two adjacent first electrodes along the first direction, and at least one of the bridge units each comprises at least one bridge line, where N is an integer and N>2; and wherein the plurality of touch units further comprises second touch units each comprising two first electrodes and two second electrodes, an area occupied by the first touch unit and an area occupied by each of the second touch units being equal to each other, and the number of the first electrodes in the first touch unit is greater than the number of the first electrodes in each of the second touch units.

\* \* \* \* \*